(12) United States Patent
Onai et al.

(10) Patent No.: US 7,135,380 B2
(45) Date of Patent: Nov. 14, 2006

(54) METHOD FOR MANUFACTURING SEMICONDUCTOR DEVICE

(75) Inventors: Satoshi Onai, Gunma (JP); Hirotsugu Hata, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/165,083

(22) Filed: Jun. 22, 2005

(65) Prior Publication Data

US 2005/0287765 A1     Dec. 29, 2005

(30) Foreign Application Priority Data

Jun. 29, 2004   (JP)   ............................ P2004-191573

(51) Int. Cl.
*H01L 21/76*   (2006.01)
(52) U.S. Cl. ...................... 438/430; 438/692; 438/700; 438/702
(58) Field of Classification Search ................ 438/430, 438/692, 700, 702
See application file for complete search history.

(56) References Cited

U.S. PATENT DOCUMENTS 4,454,647 A  *  6/1984  Joy et al. .................... 438/361
5,943,578 A  *  8/1999  Katakabe et al. ........... 438/359

FOREIGN PATENT DOCUMENTS

JP           09-008119          1/1997

* cited by examiner

*Primary Examiner*—Mary Wilczewski
*Assistant Examiner*—Toniae M. Thomas
(74) *Attorney, Agent, or Firm*—Fish & Richardson P.C.

(57) ABSTRACT

In a conventional method for manufacturing a semiconductor device, there are problems that a concave part is formed in a formation region of an isolation region, no flat surface is formed in the isolation region, and a wiring layer is disconnected above the concave part. In a method for manufacturing a semiconductor device of the present invention, when a silicon oxide film used for a STI method is removed, an HTO film covering an inner wall of a trench is partially removed to form a concave part in an isolation region. Thereafter, a TEOS film is deposited on an epitaxial layer including the concave part and is etched back. Accordingly, an insulating spacer is buried in the concave part. Thus, an upper surface of the isolation region becomes a substantially flat surface. Consequently, even if a wiring layer is formed above the concave part in the isolation region, disconnection thereof can be prevented. Moreover, in the isolation region, the substantially flat surface makes it possible to form a passive element such as a capacity element.

4 Claims, 6 Drawing Sheets

METHOD FOR MANUFACTURING SEMICONDUCTOR DEVICE

BACKGROUND OF THE INVENTION

1. Field of the Invention

The present invention relates to an element isolation technology in a method for manufacturing a semiconductor device.

2. Description of the Related Art

In a conventional method for manufacturing a semiconductor device, there is a technology of realizing flatness and miniaturization of a surface of a semiconductor layer by use of a STI (shallow trench isolation) method instead of a LOCOS (local oxidation of silicon) method. A groove formed by the STI method is filled with an insulating film, and a thermal oxide film is formed on a sidewall of a trench formed from an upper surface of the insulating layer. Thereafter, by use of a CVD (chemical vapor deposition) method, the trench is filled with a CVD oxide film. Thus, an isolation region is formed. This technology is described for instance in Japanese Patent Application Laid-open No. Hei 9-8119 (p. 7 to 9, FIGS. 2 to 10).

As described above, in the conventional method for manufacturing a semiconductor device, after a thermal oxide film and a silicon nitride film are selectively formed on a surface of an epitaxial layer, a first shallow groove is formed by use of the STI method. Thereafter, a CVD oxide film is formed on the epitaxial layer so as to fill up the first shallow groove. Subsequently, a first round of CMP method (chemical mechanical polishing) is performed to etch back the CVD oxide film and form a flat surface. Accordingly, a second deep groove is formed from an upper surface of the CVD oxide film, and an element isolation region is formed.

Next, after a thermal oxide film is formed first on a sidewall of the second deep groove, a CVD oxide film is formed on the epitaxial layer, and the second deep groove is filled with the CVD oxide film. Thereafter, by use of a silicon nitride film as a stopper film, a second round of CMP method is performed to etch back the CVD oxide film. Subsequently, after the silicon nitride film used for the STI method is removed by etching, the thermal oxide film below the silicon nitride film is removed.

In this event, by use of the conventional method for manufacturing a semiconductor device, a part of the CVD oxide film in the second deep groove is also removed when the thermal oxide film is removed due to an etching rate ratio between the thermal oxide film and the CVD oxide film. Particularly, in the isolation region, a concave part is formed with respect to the surface of the epitaxial layer in the other region. Thus, there is a problem that it is difficult to form a passive element on an upper surface of the isolation region in which the concave part is formed. Moreover, there is a problem that the concave part causes a wiring layer formed on the upper surface of the isolation region to be easily disconnected.

SUMMARY OF THE INVENTION

The present invention is made in consideration for the foregoing problems. A method for manufacturing a semiconductor device of the present invention includes the steps of forming a first insulating film on a surface of a semiconductor layer, the first insulating film having an opening provided in a desired region, and forming a groove in the semiconductor layer through the opening; forming a second insulating film so as to fill up the groove, and forming a trench from a surface of the second insulating film; forming a third insulating film on the second insulating film, forming a polycrystalline silicon film on the third insulating film, and filling the trench with the third insulating film and the polycrystalline silicon film; polishing the second insulating film, the third insulating film and the polycrystalline silicon film by use of the first insulating film as a stopper film; and forming an insulating spacer in a concave part formed by partially removing the third insulating film when the first insulating film is removed by etching. Therefore, the method of the present invention includes the step of forming the insulating spacer for the concave part in an upper part of the third insulating film, which is formed when the first insulating film is removed. Thus, it is possible to prevent a material such as the polycrystalline silicon film used in the other steps from remaining in the concave part. Moreover, by filling the concave part with the insulating spacer, a flat upper surface of an isolation region can be realized, and a passive element such as a capacity element can be formed on the upper surface of the isolation region. Moreover, it is possible to prevent disconnection of a wiring layer on the upper surface of the isolation region.

Moreover, in the method for manufacturing a semiconductor device of the present invention, the second insulating film is formed by depositing a HTO (high temperature oxide) film on an NSG (non-doped-silicate glass) film by use of a low pressure CVD method, the NSG film being deposited by use of a high density plasma CVD (HDP CVD) method. Therefore, in the present invention, the NSG film deposited by use of the high density plasma CVD method has a good filling property, and the groove in the semiconductor layer can be filled up with the NSG film. Moreover, the HTO film deposited by use of the low pressure CVD method has a good step covering property, and can be used as a hard mask in formation of the trench.

In the present invention, after the HTO film is deposited in the trench which forms the isolation region, the polycrystalline silicon film is deposited on the HTO film to fill up the trench. Accordingly, an amount of the polycrystalline silicon film deposited is reduced, and an amount of the films polished by use of the CMP method is also reduced. Thus, manufacturing costs can be suppressed.

Moreover, in the present invention, when a thermal oxide film used for the STI method is removed, a part of the HTO film in the trench is removed, and the concave part is formed in the isolation region. However, in the subsequent step, the concave part is filled up with an insulating spacer formed of a TEOS (tetra ethyl ortho silicate) film. Thus, flatness in the isolation region can be realized. Consequently, it is possible to reduce a residue of a polysilicon film and the like, which remains in the concave part in the other steps. Moreover, short-circuiting caused by the residue, which is removed from the concave part and reaches an element formation region, is prevented. Thus, yield can be improved. Meanwhile, by realizing the flat upper surface of the isolation region, the passive element such as the capacity element, for example, can be formed on the upper surface of the isolation region. Moreover, disconnection of the wiring layer formed on the upper surface of the isolation region can be prevented.

Furthermore, in the present invention, the groove formed by use of the STI method can be filled up with the NSG film which has the good filling property and is deposited by use of the high density plasma CVD method. Thus, the HTO film having the good covering property can be used as the hard mask in formation of the trench.

DESCRIPTION OF THE PREFERRED EMBODIMENTS

Figure 7:
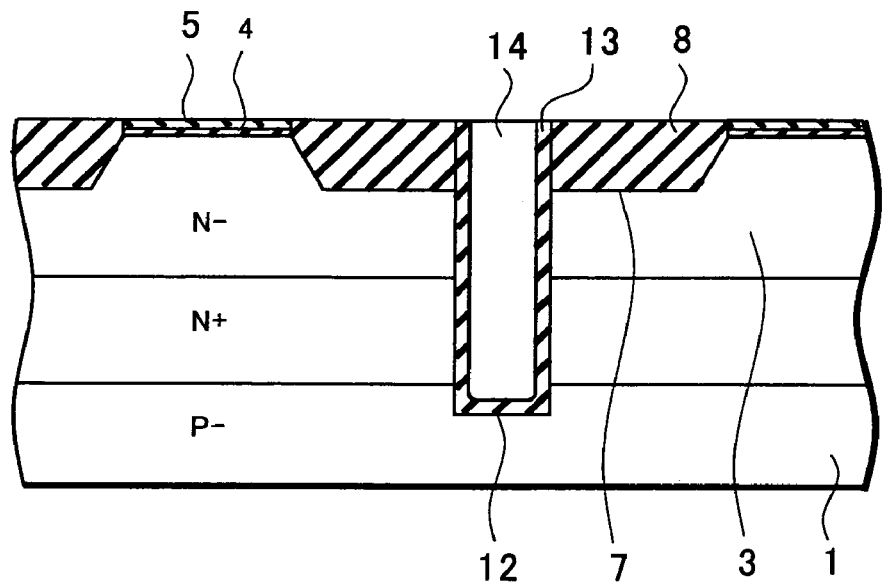
FIG. 7 is a cross-sectional view showing the method for manufacturing a semiconductor device according to the embodiment of the present invention.
Figure 8:
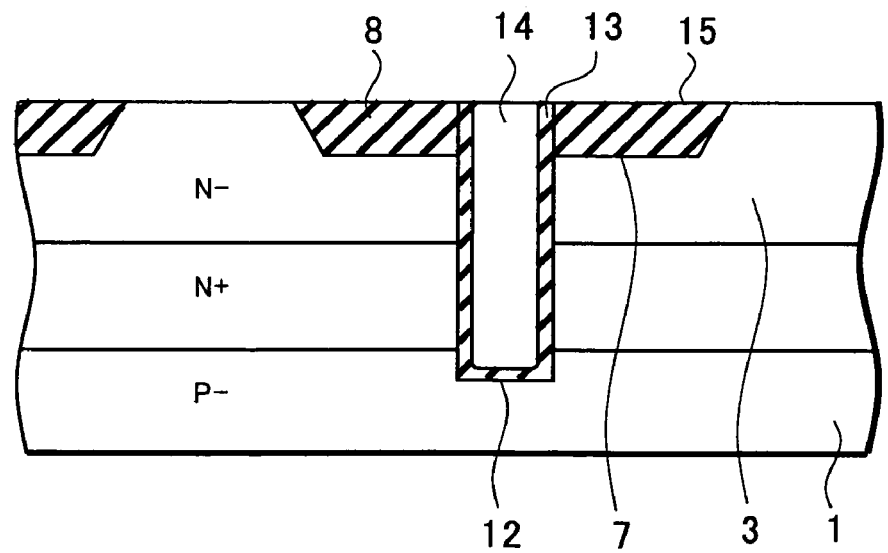
FIG. 8 is a cross-sectional view showing the method for manufacturing a semiconductor device according to the embodiment of the present invention.
Figure 9:
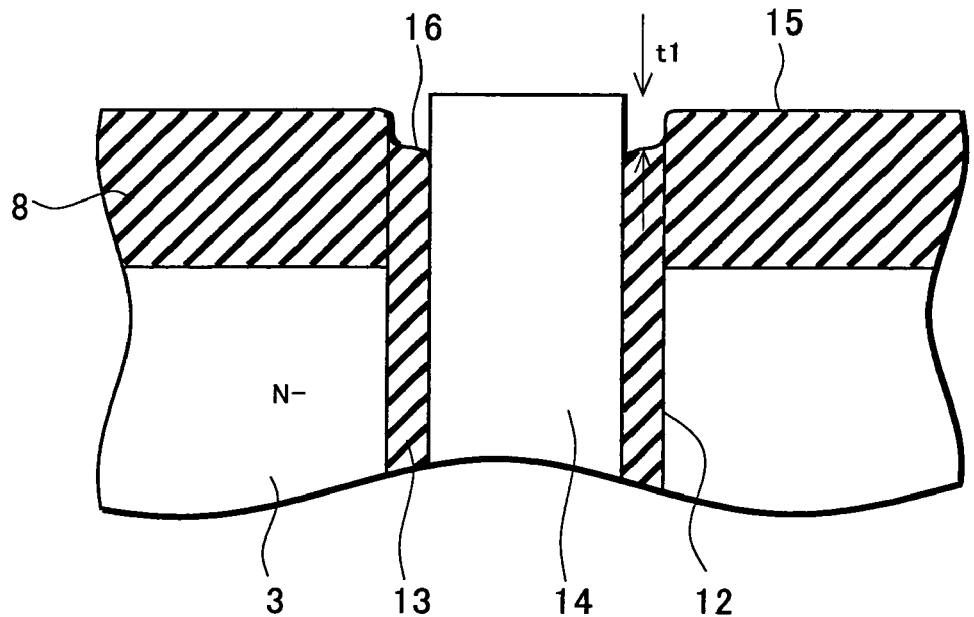
FIG. 9 is a cross-sectional view showing the method for manufacturing a semiconductor device according to the embodiment of the present invention.
Figure 10:
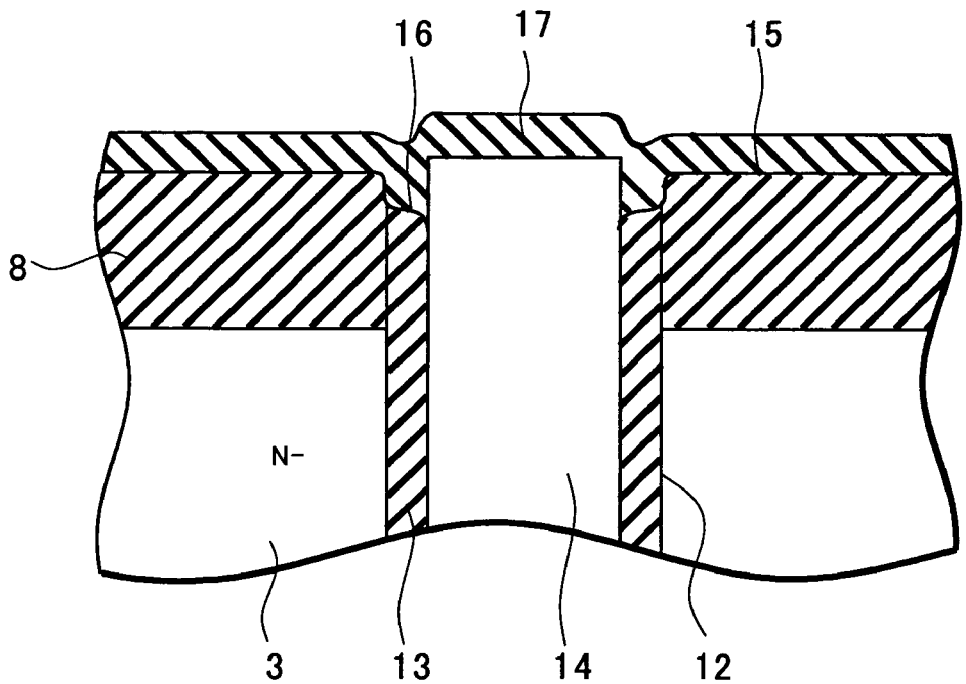
FIG. 10 is a cross-sectional view showing the method for manufacturing a semiconductor device according to the embodiment of the present invention.
Figure 11:
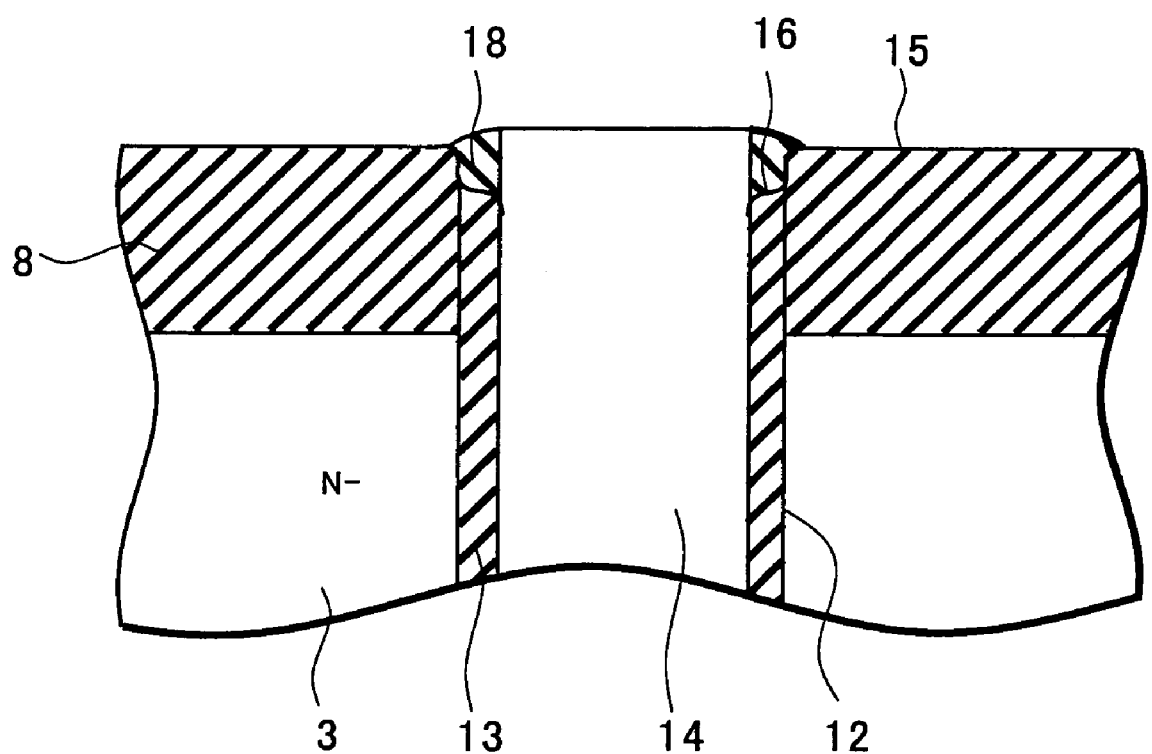
FIG. 11 is a cross-sectional view showing the method for manufacturing a semiconductor device according to the embodiment of the present invention.

With reference to FIGS. 1 to 11, a method for manufacturing a semiconductor device according to an embodiment of the present invention will be described in detail below. FIGS. 1 to 8 are cross-sectional views for showing the method for manufacturing a semiconductor device of the embodiment of the present invention. FIGS. 9 to 11 are cross-sectional views for showing the method for manufacturing a semiconductor device of the embodiment of the present invention, which are enlarged views of an isolation region. Note that FIGS. 1 to 11 show a region where the isolation region is formed. In each of element formation regions separated by the isolation region, various elements such as a bipolar transistor, an N-channel MOS transistor and a P-channel MOS transistor are formed.

Figure 1:
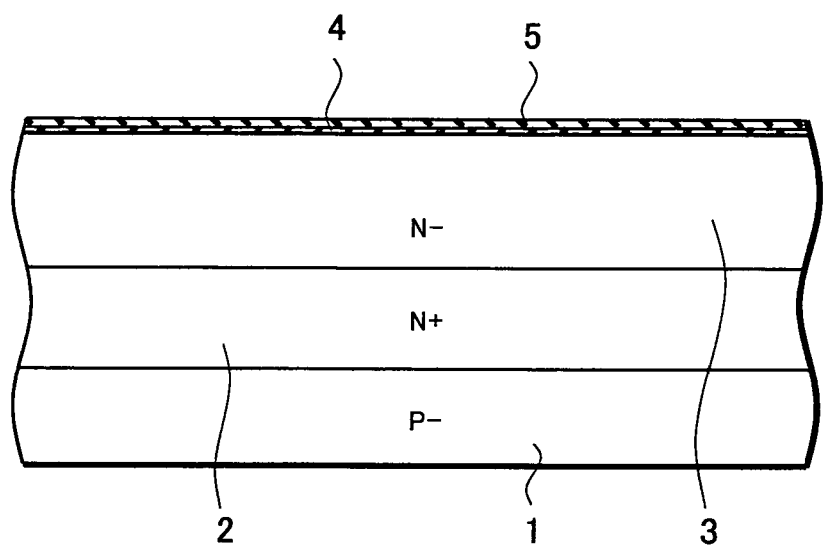
FIG. 1 is a cross-sectional view showing a method for manufacturing a semiconductor device according to an embodiment of the present invention.

As shown in FIG. 1, a P-type single crystal silicon substrate 1 is prepared. A surface of the substrate 1 is thermally oxidized to form a thermal oxide film on the entire surface. Thereafter, an N-type buried diffusion layer 2 is formed by use of a heretofore known photolithography technology.

Next, the substrate 1 is placed on a susceptor of an epitaxial growth apparatus. Thereafter, the substrate is heated up to about 1200° C., and $SiHCl_3$ gas and $H_2$ gas are introduced into a reaction tube. Thus, an epitaxial layer 3 is grown on the substrate 1. Subsequently, a silicon oxide film 4 is formed on the epitaxial layer 3 by use of a thermal oxidation method, and a silicon nitride film 5 is deposited on the silicon oxide film 4. Note that the silicon oxide film 4 in this embodiment corresponds to a "thermal oxide film" of the present invention. In addition, although the silicon oxide film 4 and the silicon nitride film 5 in this embodiment correspond to a "first insulating film" of the present invention, the "first insulating film" of the present invention may be a film which can be used for a STI method and a CMP method. Moreover, the substrate 1 and the epitaxial layer 3 in this embodiment correspond to a "semiconductor layer" of the present invention. Although a case where one epitaxial layer 3 is formed on the substrate 1 is described in this embodiment, the present invention is not limited to this case. For example, as the "semiconductor layer" of the present invention, only the substrate may be used, or a plurality of epitaxial layers may be laminated on the substrate. Moreover, the substrate may be an N-type single crystal silicon substrate or a compound semiconductor substrate.

Figure 2:
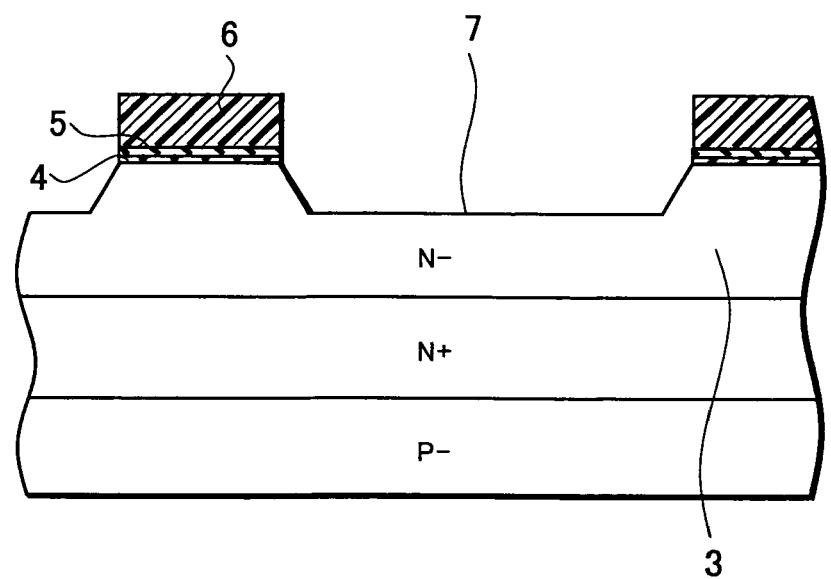
FIG. 2 is a cross-sectional view showing the method for manufacturing a semiconductor device according to the embodiment of the present invention.

As shown in FIG. 2, by use of the heretofore known photolithography technology, a photoresist 6 is formed as a selective mask, the photoresist having an opening provided in a portion where a groove 7 is formed by use of the STI method. After the silicon oxide film 4 and the silicon nitride film 5 are removed by dry etching, about 5000 Å of the epitaxial layer 3 is also removed. The groove 7 is formed in the surface of the epitaxial layer 3. Note that the groove 7 in this embodiment corresponds to a "groove" of the present invention. However, the "groove" of the present invention does not have to be limited to the case of the formation by use of the STI method. For example, the groove may be formed by use of an arbitrary manufacturing method as long as the groove has a concave structure with respect to the surface of the epitaxial layer 3.

Figure 3:
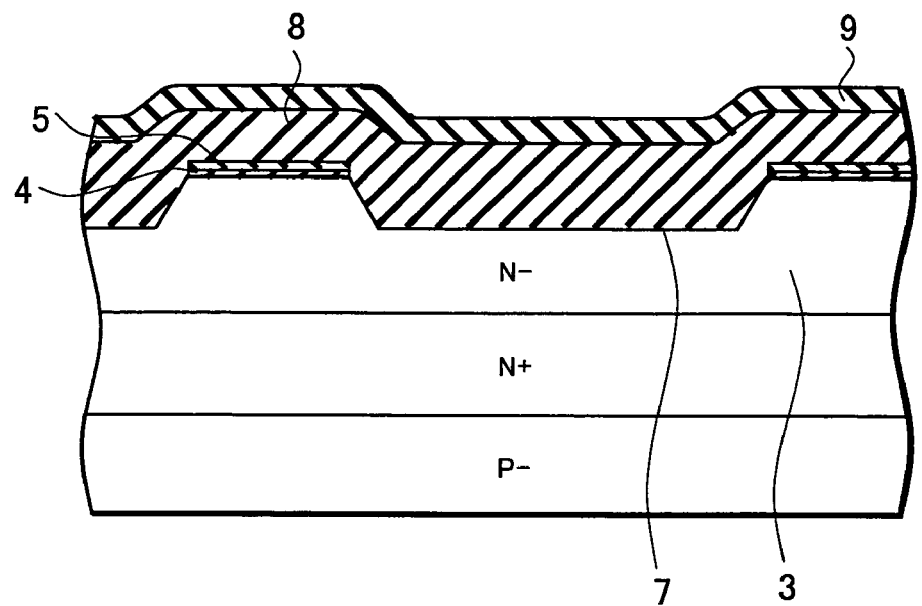
FIG. 3 is a cross-sectional view showing the method for manufacturing a semiconductor device according to the embodiment of the present invention.

As shown in FIG. 3, after the photoresist 6 is removed, an NSG film 8 is deposited on the epitaxial layer 3 by use of a high density plasma CVD method. In this event, about 6000 Å of the NSG film 8, for example, is deposited so as to fill up the groove 7.

Next, by use of a low pressure CVD method, an HTO film 9 is deposited on the NSG film 8 under a temperature condition of about 800° C. In this event, the HTO film 9 is deposited to have a thickness in a range of 3000 Å to 5000 Å. Moreover, the HTO film 9 is a film having a better step covering property than the NSG film 8. Meanwhile, the NSG film 8 has a better filling property than the HTO film 9, and is used for the step of filling up the groove 7 as described above. Note that the NSG film 8 and the HTO film 9 in this embodiment correspond to a "second insulating film" of the present invention. The "second insulating film" of the present invention may be a film which fills up the groove 7. Moreover, as the "second insulating film" of the present invention, at least only the NSG film 8 may be used.

Figure 4:
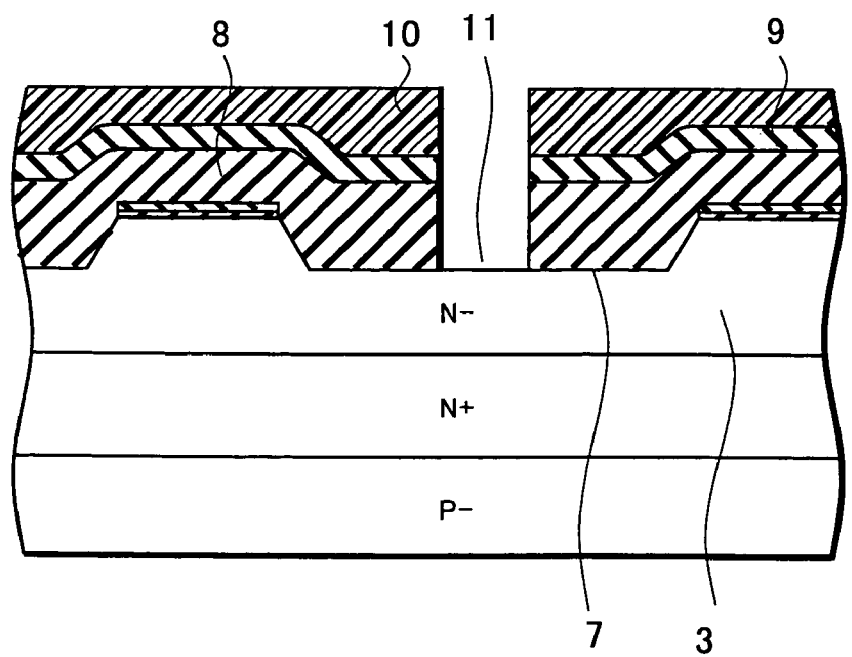
FIG. 4 is a cross-sectional view showing the method for manufacturing a semiconductor device according to the embodiment of the present invention.

As shown in FIG. 4, by use of the heretofore known photolithography technology, a photoresist 10 is formed as a selective mask on the HTO film 9, the photoresist having an opening provided in a portion where a trench 12 (see FIG. 5) for an isolation region is formed. Thereafter, the NSG film 8 and the HTO film 9 are selectively removed by dry etching, and an opening 11 is formed in the NSG film 8 and the HTO film 9 in a formation region of the trench 12.

Figure 5:
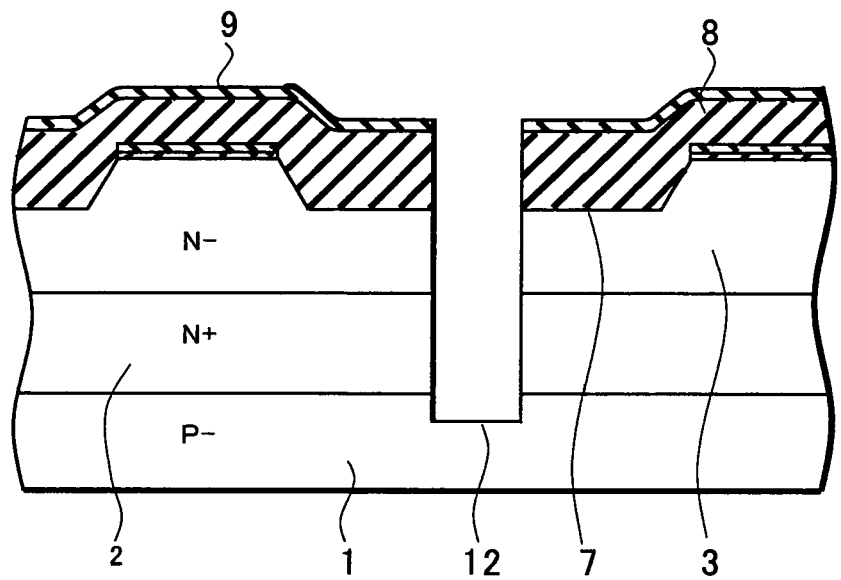
FIG. 5 is a cross-sectional view showing the method for manufacturing a semiconductor device according to the embodiment of the present invention.

As shown in FIG. 5, after the photoresist 10 is removed, the trench 12 is formed by drying etching using the NSG film 8 and the HTO film 9 as a hard mask. Here, the trench 12 is formed to have a depth of about 6 μm, for example. Note that, the HTO film 9 is also removed from the surface in the step of forming the trench 12, and the thickness of the HTO film 9 is also reduced after forming the trench 12. Here, the reason why the HTO film 9 is deposited to have the thickness within the range described above is because a problem of etching failure may occur if the HTO film 9 is thinner than 3000 Å. Meanwhile, if the HTO film 9 is thicker than 5000 Å, it may become difficult to pattern the NSG film 8 and the HTO film 9.

Figure 6:
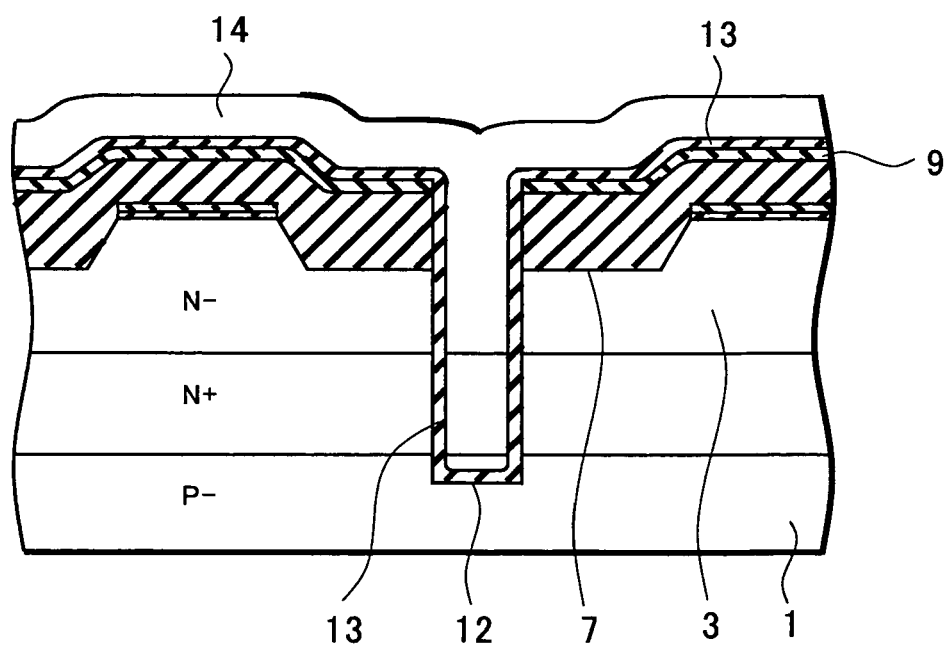
FIG. 6 is a cross-sectional view showing the method for manufacturing a semiconductor device according to the embodiment of the present invention.

As shown in FIG. 6, in the trench 12 and on the HTO film 9, an HTO film 13 is deposited under a temperature condition of about 800° C. by use of the low pressure CVD method. The HTO film 13 is deposited to have a thickness of about 3000 Å, and a part of the trench 12 is filled up from an inner wall of the trench 12. Thereafter, on the HTO film 13, a polycrystalline silicon film 14 is deposited by use of a CVD method. The polycrystalline silicon film 14 is deposited to have a thickness of about 8000 Å, and inside of the trench 12 is completely filled up with the polycrystalline silicon film 14. Note that the HTO film 13 in this embodiment corresponds to a "third insulating film" of the present invention. The "third insulating film" of the present invention may be a film which fills up the trench 12.

In this embodiment, before the step of filling the trench 12 with the HTO film 13, a step of forming a silicon oxide film on the inner wall of the trench 12 by use of the thermal oxidation method is omitted. By omitting the step of forming the silicon oxide film, the substrate 1 itself is never placed in a heat environment due to the thermal oxidation method, and, for example, occurrence of a crystal defect from a corner of the groove 7 or the trench 12 can be significantly reduced.

As shown in FIG. 7, the NSG film 8, the HTO films 9 and 13, and the polycrystalline silicon film 14 are polished by use of the CMP method using the silicon nitride film 5 as a stopper film, and are at least partially removed. By this step, obtained is a structure in which the groove 7 is filled up with the NSG film 8 and the trench 12 is filled up with the HTO film 13 and the polycrystalline silicon film 14.

As shown in FIG. 8, after the silicon nitride film 5 is removed by using phosphoric acid of about 160° C., the silicon oxide film 4 is removed by using diluted hydrogen fluoride (HF). In this event, when the silicon oxide film 4 is removed, a part of the NSG film 8 is also removed, and a flat surface 15 is substantially formed in the isolation region.

Note that, in this embodiment, the NSG film 8 deposited in the groove 7 and the polycrystalline silicon film 14 deposited in the trench 12 can be polished and removed by a single CMP method. Specifically, a manufacturing process can be simplified compared to the case where a first round of CMP method is performed after the NSG film 8 is deposited in the groove 7, and a second round of CMP method is performed after the polycrystalline silicon film 14 is deposited in the trench 12. Moreover, since the expensive CMP method is performed only once, manufacturing costs can be reduced.

Moreover, in this embodiment, before the trench 12 is filled up with the polycrystalline silicon film 14, the HTO film 13 is buried therein. Accordingly, by reducing an amount of the polycrystalline silicon film 14 deposited, a thickness of the polycrystalline silicon film 14 deposited on the epitaxial layer 3 and the like can also be reduced. Thus, by the step using the CMP method, an amount of the polycrystalline silicon film 14 polished can be reduced, and the time spent for the expensive CMP method can be shortened.

FIG. 9 shows an enlarged cross-sectional view of the region of the trench 12 after the silicon oxide film 4 is removed as described above with reference to FIG. 8.

As shown in FIG. 9, when the silicon oxide film 4 is removed by using the diluted hydrogen fluoride (HF), the HTO film 13 between the polycrystalline silicon film 14 and the NSG film 8 is also removed. Here, an etching rate ratio between the HTO film 13 and the NSG film 8 with respect to the diluted hydrogen fluoride is, for example, 10:1. Thus, the HTO film 13 between the polycrystalline silicon film 14 and the NSG film 8 is selectively etched, and a concave part 16 is formed to have a depth t1 of about 3000 Å, for example, between the polycrystalline silicon film 14 and the NSG film 8.

Here, description will be given of a problem in the case where a bipolar transistor, a MOS transistor, and the like are formed in an element formation region without filling up the concave part 16 formed in the isolation region.

In the isolation region, when the silicon oxide film 4 is removed, the concave part 16 is formed so as to surround the polycrystalline silicon film 14. Meanwhile, in the element formation region, for example, a gate electrode of the MOS transistor, a base extraction electrode of the bipolar transistor, a spacer, an emitter extraction electrode, and the like are formed. The gate electrode and the like are formed by selectively removing a polycrystalline silicon film after the polycrystalline silicon film is deposited on the epitaxial layer 3. In this event, the polycrystalline silicon film is not completely removed in the isolation region, and a residue of the polycrystalline silicon film remains in the concave part 16.

Thereafter, the residue of the polycrystalline silicon film in the concave part 16 is removed by using an etchant used when an oxide film is removed in an element formation step. Specifically, in the concave part 16, the etchant enters from a boundary surface between the polycrystalline silicon film 14 or the NSG film 8 and the residue of the polycrystalline silicon film. Thus, the residue of the polycrystalline silicon film is removed from the concave part 16. Thereafter, the removed residue of the polycrystalline silicon film reaches the upper surface of the element formation region. Accordingly, for example, a structure is formed, in which each region of the bipolar transistor is short-circuited by the residue. Thus, yield is drastically deteriorated. This is because impurities are introduced into the polycrystalline silicon film in each step.

Consequently, in this embodiment, as shown in FIG. 10, after the silicon oxide film 4 is removed, a TEOS film 17 is deposited by use of the low pressure CVD method so as to fill up the concave part 16. Note that the TEOS film 17 in this embodiment corresponds to a "fourth insulating film" of the present invention. The "fourth insulating film" of the present invention may be a film which fills up the concave part 16. For example, the fourth insulating film may be a silicon oxide film, an HTO film or a silicon nitride film, which is deposited by use of the low pressure CVD method or an atmospheric pressure CVD method. Moreover, the fourth insulating film may be a SOG (spin on glass) film formed by use of a coating method.

As shown in FIG. 11, the TEOS film 17 is etched back, and the concave part 16 in the formation region of the trench 12 is filled up with the TEOS film 17. Thus, the isolation region can be flattened. Specifically, in the formation region of the trench 12, an insulating spacer 18 formed of the TEOS film 17, and the HTO film 13 are buried between the polycrystalline silicon film 14 and the NSG film 8. Thus, in the step of depositing the polycrystalline silicon film, which is performed after the concave part 16 is filled up with the insulating spacer 18, occurrence of a residue of the polycrystalline silicon film in the concave part 16 can be significantly reduced.

Moreover, in this embodiment, an interlayer insulating layer and a wiring layer are formed on the upper surface of the isolation region in the state where the concave part 16 in the formation region of the trench 12 is filled up with the insulating spacer 18 and the isolation region is flattened. Specifically, the flat surface 15 in the isolation region can prevent disconnection of the wiring layer on the upper surface of the concave part 16. Moreover, the flat surface 15 in the isolation region makes it possible to dispose a passive element such as a capacity element.

Note that, in the embodiment described above, the description was given of the case where the NSG film is used as the film to fill up the groove 7. However, without being limited thereto, other insulating films may be used.

Moreover, the description was given of the case where the HTO film is used as the film which is deposited on the NSG film to fill up the groove 7. However, without being limited thereto, other films may be used as long as the films have a good covering property and function as a hard mask in formation of a trench. For example, a silicon oxide film, a TEOS film or a silicon nitride film may be used, which is deposited by use of the low pressure CVD method or the atmospheric pressure CVD method. Moreover, a SOG film may be used, which is formed by use of the coating method. Besides the above, various changes can be made without departing from the scope of the present invention.

What is claimed is:

1. A method for manufacturing a semiconductor device, comprising the steps of:

forming a first insulating film on a surface of a semiconductor layer, the first insulating film having an opening provided in a desired region, and forming a groove in the semiconductor layer through the opening;

forming a second insulating film so as to fill up the groove, and forming a trench from a surface of the second insulating film;

forming a third insulating film on the second insulating film, forming a polycrystalline silicon film on the third insulating film, and filling the trench with the third insulating film and the polycrystalline silicon film;

polishing the second insulating film, the third insulating film and the polycrystalline silicon film by use of the first insulating film as a stopper film; and forming an insulating spacer in a concave part formed by partially removing the third insulating film when the first insulating film is removed by etching.

2. The method for manufacturing a semiconductor device according to claim 1, wherein the insulating spacer is formed by forming a fourth insulating film on the semiconductor layer so as to fill up the concave part, and etching back the fourth insulating film.

3. The method for manufacturing a semiconductor device according to claim 1, wherein the second insulating film is formed by depositing an HTO film on an NSG film by use of a low pressure CVD) method, the NSG film being deposited by use of a high density plasma CVD method.

4. The method for manufacturing a semiconductor device according to claim 1, wherein the first insulating film is formed by forming a thermal oxide film on the semiconductor layer and depositing a silicon nitride film on the thermal oxide film, and the concave part is formed by removing the thermal oxide film.

* * * * *